United States Patent

[11] 3,566,154

[72] Inventors Jack C. Loessi
Ellicott City;
Reginald M. Rhue, Laurel, Md.
[21] Appl. No. 789,092
[22] Filed Jan. 2, 1969
[45] Patented Feb. 23, 1971
[73] Assignee the United States of America as represented by the Secretary of the Navy

[54] INTEGRATED CIRCUIT COMMUTATOR
5 Claims, 3 Drawing Figs.

[52] U.S. Cl. .......... 307/223, 235/92, 307/299, 328/43, 328/48, 307/284
[51] Int. Cl. .......... H03k 23/08
[50] Field of Search .......... 307/221, 223, 299; 317/235, 40.13; 328/43, 48, 49; 235/8, 67, 68

[56] References Cited
UNITED STATES PATENTS
3,134,026 5/1964 Earle .......... 307/303X
3,316,451 4/1967 Silberman .......... 307/223X

*Primary Examiner*—Donald D. Forrer
*Assistant Examiner*—R.C. Woodbridge
*Attorneys*—Justin P. Dunlavey and John O. Tresansky

ABSTRACT: Invention is a ring counter which may be fabricated in any desired practical length by using integrated circuit techniques. It utilizes split collector transistors in conjunction with silicon controlled rectifiers and standard transistors to effect stepping at a rapid rate. Operation under wide temperature conditions and with extremely low power consumption is provided. Provision is also made for insuring that no more than one digital "1" will be present in the counter at any time.

COUNTING SEQUENCE

100000XX
010000XX
001000XX
000100XX
000010XX
000001XX
100000XX
.
.
.
ETC.

X = NOT USED

INVENTORS
JACK C. LOESSI
REGINALD M. RHUE

BY J. O. Tresansky
ATTORNEY

INVENTORS
JACK C. LOESSI
REGINALD M. RHUE

INVENTORS
JACK C. LOESSI
REGINALD M. RHUE

INTEGRATED CIRCUIT COMMUTATOR

INTRODUCTION, BACKGROUND AND OBJECTS

The present invention relates generally to counter circuits and more particularly to an improved integrated circuit ring counter.

As is well known, a ring counter is a circuit consisting of a given number of stages wherein a digital 1 is circulated by advancing it by one stage upon the application of a step pulse. One stage will always be ON, i.e. contain a digital 1, but two stages will never be ON at the same time.

In satellite telemetry systems there is a need for a counter circuit that can be used to drive the FET commutator analogue switch employed. Requirements for such a counter circuit include provision for reset in the event that more than one digital 1 occurs or if no digital is present, that the open circuit output voltage of each stage must be approximately equal to the positive voltage applied to that stage when it is in digital state, that the open circuit output voltage of a stage must be no more than one volt or less than one-half volt above the negative power terminal (normally ground) when that stage is a digital 1, and that the output impedance of each stage must be no more than 100,000 ohms.

Although the circuit of the present invention was designed especially to satisfy the above requirements, it obviously may be used in any application requiring a highly efficient ring counter.

Objects of the invention are to provide an integrated circuit ring counter which may include up to ten stages on a single chip of silicon, which is capable of stepping at a rate of DC up to 10KHz., that will operate at voltages from 8 to 15 and with temperature variations from − 40° to + 100° centigrade, and which will consume no more than 25 milliwatts of power at 12 volts.

An additional object of the invention resides in the provision of a ring counter which includes means for insuring that no more than one digital will be present at any time.

Further objects of the invention will appear as the description thereof proceeds,

DESCRIPTION

Figure 1:
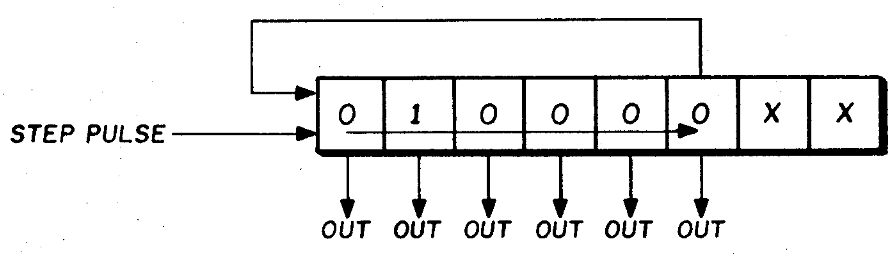
FIG. 1 is a block diagram illustrating a conventional eight stage ring counter wired for a length of six, and with a table showing the counting sequence.
Figure 2:
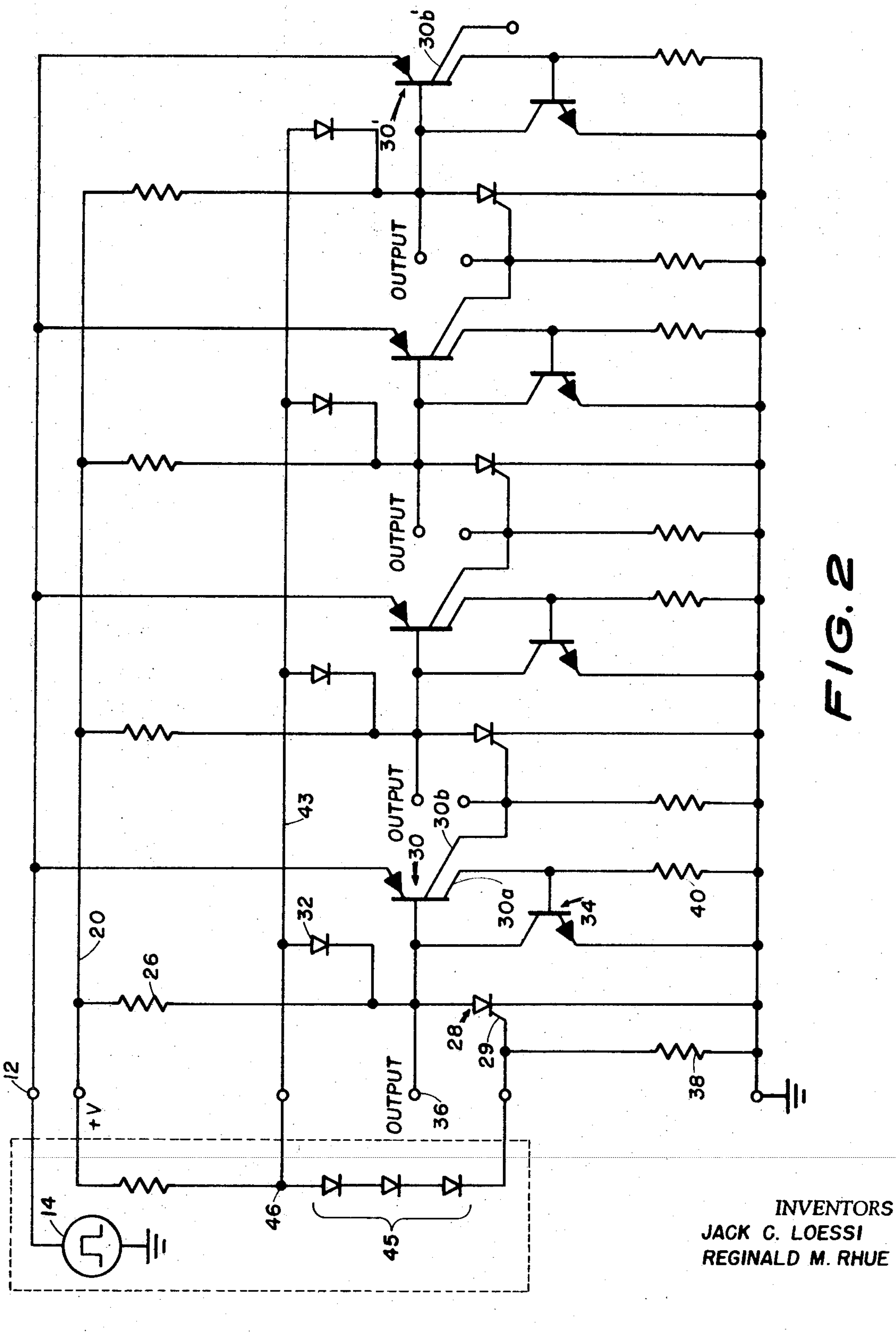
FIG. 2 is a circuit diagram of a four stage ring counter according to the present invention.

Referring first briefly to FIG. 1, a block diagram of a ring counter is shown, together with a table showing the counting sequence. The ring counter of FIG. 1 comprises eight stages but is wired for a length of six. As will be obvious, the counter may be of any desired practical length. For example, in FIG. 2 there is shown a four stage counter circuit which may be fabricated on a single chip of silicon by presently known techniques. Any number of these circuits may be connected in series to obtain counter lengths of 8, 12, 16, etc. Any counter length may be obtained by short-circuiting the output leads of unwanted stages to ground.

Figure 3:
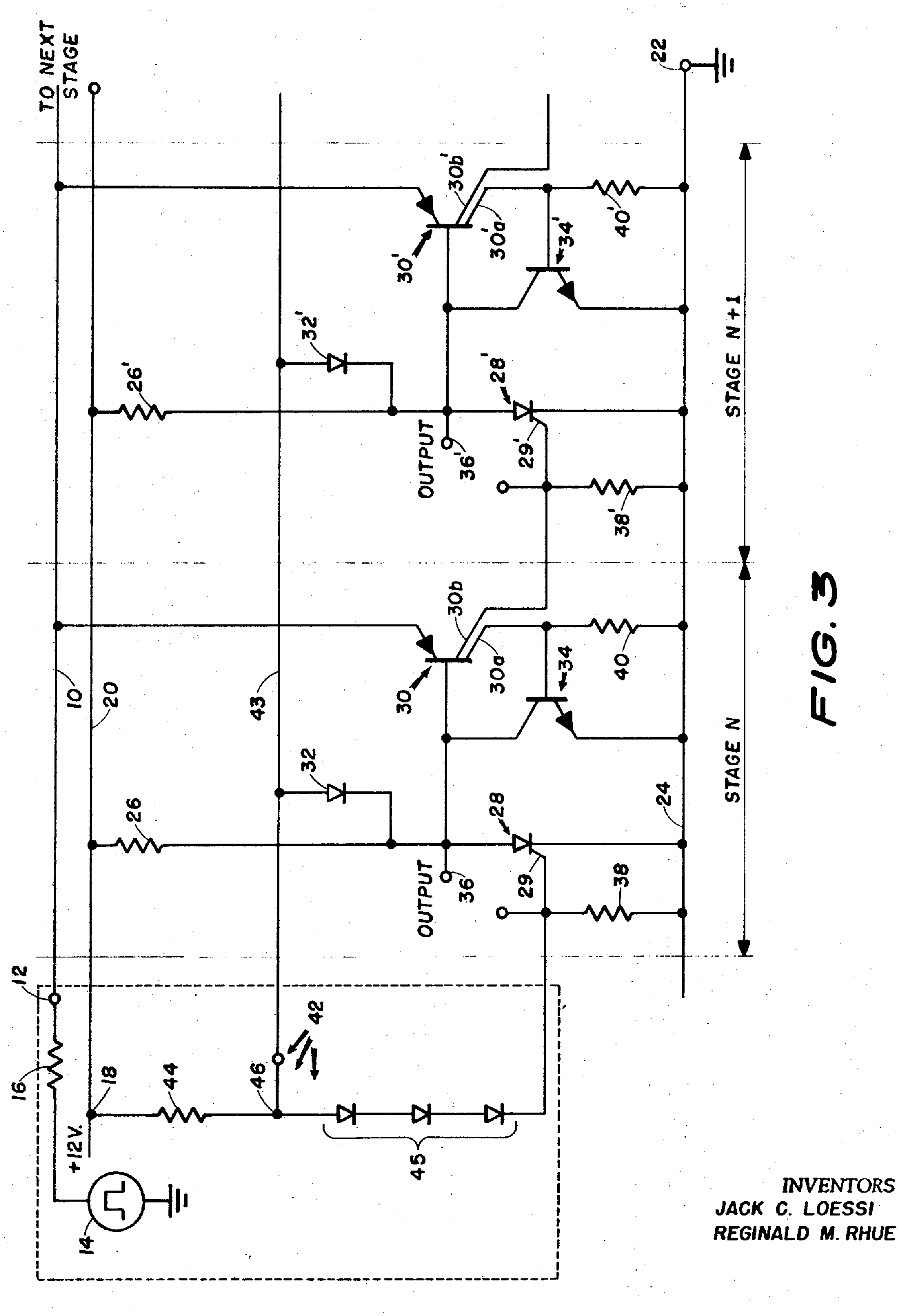
FIG. 3 is a circuit diagram showing, for purposes of a detailed description, two stages of the ring counter of FIG. 2.

Attention is now directed to FIG. 3, which discloses two ring counter stages connected in cascade. These stages are identical and for convenience will be referred to hereinafter as stages N and N + 1. Stages N and N + 1, and any succeeding stages, are connected to a bus 10 which is connected to an input terminal 12. A step pulse generator 14 is connected to the terminal 12 through a resistor 16. A 12-volt power supply (not shown) is connected to terminal 18 at the end of a power bus 20. A ground terminal 22 is connected to a ground bus 24.

The counter stage N includes a load resistor 26, a silicon controlled rectifier (SCR) 28 having a gate 29, a split collector transistor 30, a diode 32, an NPN transistor 34, an output terminal 36, a gate to cathode shunting resistor 38, and a base to emitter resistor 40.

The counter stage N + 1 employs identical components which bear the same reference numerals, primed for convenience in identification.

In stage N, which for the purpose of this description will be called the first stage, the load resistor 26 is connected between the power bus 20 and the output terminal 36. The anode of the SCR 28 is connected to said output terminal and the cathode to the ground bus 24. The SCR gate 29 is connected to one terminal of the shunting resistor 38 and the other terminal of said resistor is connected to ground. The SCR gate 29 is also connected to an external control circuit 42, which will be described in more detail hereinafter. The base of the split collector transistor 30 is connected to the output terminal 36, as is the collector of the transistor 34. The emitter of the transistor 30 is connected to the input bus 10, and one collector, indicated at 30*a*, is connected to one terminal of the resistor 40 and to the base of the transistor 34, the other terminal of the resistor 40 and the emitter of said transistor 34 being connected to the ground bus 24. The other collector, 30*b*, of the split collector transistor 30 is connected to the gate 29′ of the SCR 28′ of the counter stage N + 1.

In operation, let it be assumed that stage N is ON, i.e., it contains a digital 1, and that stage N + 1 (and all following stages) are OFF, i.e., contain digital zeros. The SCR 28 will be saturated so that the voltage at the terminal 36 will be approximately 0.8 volt, assuming a 12-volt power supply connected to the terminal 18. The voltage at the input terminal 12 is zero and the split collector transistor 30 will not conduct. Under this condition the transistor 34 will have no base current and also will not conduct.

The condition described hereinabove will remain in effect until a step pulse is supplied from the generator 14 to the input terminal 12 and thus to the bus 10. As the voltage on the bus 10 rises, it forward biases the emitter-base junction of transistor 30, causing it to conduct. It should be noted that the emitter current of the transistor 30 is split approximately evenly between the two collectors 30*a* and 30*b*. The split collector transistor 30′ and those of any following stages connected to the bus 10 will not conduct since the output terminal 36′ (and those of following stages) will be at the full power supply voltage. The latching structure formed by the transistors 30 and 34, will now conduct and the input voltage at the terminal 12 will be clamped at approximately 0.8 volt while the voltage at the output terminal 36 will be reduced to about 0.2 volt as a result of saturation of the transistor 34. Since the transistor 34 is saturated, it will carry all the current passing through the load resistor 26 from the power supply and there will be no voltage or current available to operate SCR 28. It will thus be cut off by having its anode current reduced below the holding current level. With the transistor 30 conducting the collector 30*b* thereof will supply current to the gate 29′ of stage N + 1 and the SCR 28′ will begin to conduct. The voltage at output terminal 36′ will drop to the SCR saturating voltage of about 0.8 volt as said SCR 28′ latches in the ON condition. Although the voltage at the terminal 36′ is low (0.8 volt) and that on the bus 10 is high (clamped at 0.8 volt by the transistors 30 and 34), there is no voltage drop across the emitter base junction of the transistor 30′ and it remains in the OFF condition.

With the SCR 28′ ON the pulse from the generator 14 may be removed from the terminal 12. Under this condition the current in the transistor 30 drops to zero and the latching structure consisting of transistors 30 and 34, is extinguished because the current on the bus 10 is reduced to a point below the holding current level. The SCR 28 and the transistors 30 and 34 will thus be turned off and the voltage at the output terminal 36 will rise to about the power supply level. SCR 28′ will no longer have gate current but will be in the ON state and the voltage at terminal 36′ will be 0.8 volt, a digital 1.

From the above it will be understood how a digital 1 is propagated from one stage of the counter to the next. The speed of modern electronic circuits permits this movement to take place in less than one microsecond. Therefore, the width of the pulse applied to the terminal 12 may be less than a microsecond. It may be much wider, except that SCR 28 and SCR 28' are both ON when the pulse is present. The action of the generator 14 is direct coupled, so that a fast rise time is not required; in fact, very slow rise times may be employed.

The digital 1 propagates as described hereinabove until it reaches the last stage of the counter, say the sixth stage of the counter shown in FIG. 1. For purposes of simplicity, however, let it be assumed that the last stage is the N + 1 stage of FIG. 3. The second collector, indicated at 30*b*', is grounded externally so that the next (first) stage of the ring counter will not come on. The next pulse attempts to move the digital 1 from stage N + 1 to a following stage, but since there is no following stage and the collector 30*b*' is grounded, the digital 1 will be lost when the pulse is removed and all the counter stages will contain digital O's.

The control circuit 42 includes a bus 43, a resistor 44, a diode string 45, a terminal 46 and a conductor 47. The bus 43 is connected to the terminal 46 which is connected to the anode junction of the uppermost diode of the string 45 (in FIG. 3) and the resistor 44, the remaining terminal of the resistor being connected to the terminal 18. The conductor 47 connects the lowermost diode of the string to the gate of the SCR in the first stage of the ring counter. The diodes 32 and 32' and those of all other stages are connected between the bus 43 and the output terminals 36 and 36' and those output terminals or all other stages.

With a digital 1 in one of the counter stages, the voltage at the terminal 46 will always be clamped at about 1.4 volts. With no digital 1 present, however, as indicated in the penultimate paragraph, the voltage at the terminal 46 rises toward full power supply level, i.e., until it exceeds the threshold of the diodes in the string 45, at which time the current in the resistor 44 will be supplied to the gate of the SCR in the first stage of the ring counter via the conductor 47. This will cause stage 1 to turn on and a new digital 1 to be injected into the first stage of the counter. Therefore the ring counter will always start with a digital 1 in the first stage.

We claim:

1. In a ring counter:
a plurality of electrically energizable stages;
means connecting said stages in a ring;
said means including a split collector transistor and a control device in each stage; and
one of the collectors of the split collector transistor of one stage being connected to the control device of the next succeeding stage except for the said one of the collectors of the split collector transistor of the last stage which is connected to ground.

2. A ring counter as recited in claim 1:
wherein the control device comprises a silicon controlled rectifier having a gate; and
wherein one of the collectors of said split collector transistor of one stage is connected to the gate of the silicon controlled rectifier of the next succeeding stage.

3. A ring counter as recited in claim 2:
including additionally a terminal for connection to a source of energy; and
a control circuit connected between said terminal and the gate of the silicon controlled rectifier of the first stage.

4. In a ring counter:
a plurality of electrically energizable stages;
means connecting said stages in a ring;
each of said stages comprising first and second transistors, a silicon controlled rectifier having a gate, and a load resistor;
each said first transistor having first and second collector;
an input terminal for connection to a pulse source;
a first terminal for connection to a source of energy;
a second terminal for connection to ground;
means connecting said first and second transistors, said silicon controlled rectifier and load resistor of each stage between said terminals;
said first-mentioned means including a control circuit connected between said first terminal and the gate of the silicon controlled rectifier of the first of said stages; and
the second collector of the first transistor of each stage being connected to the gate of the silicon controlled rectifier of the next succeeding stage, except for the second collector of the first transistor of the last stage which is connected to ground.

5. A ring counter as recited in claim 1:
wherein said control circuit comprises a third terminal;
a resistor connected between the third terminal and the first terminal; and
a diode string connected between the third terminal and the gate of the silicon controlled rectifier of the first stage.